US011552612B2

(12) United States Patent
Morii

(10) Patent No.: US 11,552,612 B2
(45) Date of Patent: Jan. 10, 2023

(54) IMPEDANCE ADJUSTMENT DEVICE AND IMPEDANCE ADJUSTMENT METHOD

(71) Applicant: DAIHEN Corporation, Osaka (JP)

(72) Inventor: Tatsuya Morii, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

(21) Appl. No.: 17/123,637

(22) Filed: Dec. 16, 2020

(65) Prior Publication Data

US 2021/0203300 A1    Jul. 1, 2021

(30) Foreign Application Priority Data

Dec. 27, 2019 (JP) .............................. JP2019-238643

(51) Int. Cl.
*H03H 7/38* (2006.01)
*H03H 11/30* (2006.01)
*H01J 37/32* (2006.01)

(52) U.S. Cl.
CPC ............. *H03H 7/38* (2013.01); *H03H 11/30* (2013.01); *H01J 37/32183* (2013.01)

(58) Field of Classification Search
CPC ...... H03H 7/38; H03H 11/30; H01J 37/32183
See application file for complete search history.

(56) References Cited

U.S. PATENT DOCUMENTS

| 7,251,121 | B2 | 7/2007 | Bhutta |
| 7,298,128 | B2 | 11/2007 | Bhutta |
| 9,196,459 | B2 | 11/2015 | Bhutta |
| 9,306,533 | B1 | 4/2016 | Mavretic |
| 9,345,122 | B2 | 5/2016 | Bhutta |
| 9,496,122 | B1 | 11/2016 | Bhutta |
| 9,525,412 | B2 | 12/2016 | Mavretic |
| 9,543,122 | B2 | 1/2017 | Bhutta |
| 9,584,090 | B2 | 2/2017 | Mavretic |
| 9,591,739 | B2 | 3/2017 | Bhutta |
| 9,697,991 | B2 | 7/2017 | Bhutta |
| 9,728,378 | B2 | 8/2017 | Bhutta et al. |
| 9,729,122 | B2 | 8/2017 | Mavretic |
| 9,745,660 | B2 | 8/2017 | Bhutta |
| 9,755,641 | B1 | 9/2017 | Bhutta |
| 9,831,064 | B2 | 11/2017 | Konno et al. |
| 9,844,127 | B2 | 12/2017 | Bhutta |
| 9,865,432 | B1 | 1/2018 | Bhutta |

(Continued)

FOREIGN PATENT DOCUMENTS

JP        2015-90759 A    5/2015

*Primary Examiner* — Samuel S Outten
(74) *Attorney, Agent, or Firm* — Bret E. Field; Bozicevic, Field & Francis LLP

(57) ABSTRACT

A high frequency power supply alternately outputs a first AC voltage and a second AC voltage to a plasma generator. The amplitudes of the first AC voltage and the second AC voltage are different from each other. An impedance adjustment device is disposed in midway of the transmission line of the first AC voltage and the second AC voltage. When the AC voltage output from the high frequency power supply is switched to a first AC voltage, a microcomputer changes the capacitance of a variable capacitor circuit to a first target value. When the AC voltage output from the high frequency power supply is switched to a second AC voltage, the microcomputer changes the capacitance of the variable capacitor circuit to a second target value.

4 Claims, 9 Drawing Sheets

(56) References Cited

U.S. PATENT DOCUMENTS

| | | |
|---|---|---|
| 10,026,594 B2 | 7/2018 | Bhutta |
| 10,217,608 B2 | 2/2019 | Mavretic |
| 10,340,879 B2 | 7/2019 | Mavretic et al. |
| 10,431,424 B2 | 10/2019 | Mavretic et al. |
| 10,431,428 B2 | 10/2019 | Bhutta et al. |
| 10,454,453 B2 | 10/2019 | Bhutta et al. |
| 10,455,729 B2 | 10/2019 | Bhutta |
| 10,460,912 B2 | 10/2019 | Bhutta et al. |
| 10,483,090 B2 | 11/2019 | Bhutta et al. |
| 10,707,057 B2 | 7/2020 | Bhutta et al. |
| 10,727,029 B2 | 7/2020 | Ulrich et al. |
| 2015/0122420 A1 | 5/2015 | Konno et al. |
| 2016/0065207 A1 | 3/2016 | Bhutta |
| 2016/0380610 A1 | 12/2016 | Ulrich |
| 2017/0099723 A1* | 4/2017 | Nagami ............ H01J 37/32091 |
| 2017/0178865 A1 | 6/2017 | Ulrich |
| 2018/0076788 A1 | 3/2018 | Decker et al. |
| 2019/0172683 A1 | 6/2019 | Mavretic et al. |
| 2019/0267212 A1 | 8/2019 | Mavretic |
| 2019/0272978 A1 | 9/2019 | Ahmed et al. |
| 2019/0326094 A1 | 10/2019 | Bhutta |
| 2020/0035461 A1 | 1/2020 | Bhutta et al. |
| 2020/0051788 A1 | 2/2020 | Ulrich |
| 2020/0066488 A1 | 2/2020 | Ulrich et al. |
| 2020/0066489 A1 | 2/2020 | Lozic et al. |
| 2020/0083022 A1 | 3/2020 | Huang et al. |
| 2020/0126765 A1 | 4/2020 | Ulrich et al. |

* cited by examiner

IMPEDANCE ADJUSTMENT DEVICE AND IMPEDANCE ADJUSTMENT METHOD

CROSS-REFERENCE TO RELATED APPLICATION

This Nonprovisional application claims priority under 35 U.S.C. § 119(a) on Patent Application No. 2019-238643 filed in Japan on Dec. 27, 2019, the entire contents of which are hereby incorporated by reference.

FIELD

The present disclosure relates to an impedance adjustment device and an impedance adjustment method.

BACKGROUND

Japanese Patent Laid-Open Publication No. 2015-90759 discloses a power supply system in which an AC voltage having a high frequency is output from an AC power supply to a load. In the power supply system described in Japanese Patent Laid-Open Publication No. 2015-90759, a first AC voltage and a second AC voltage are alternately output to the load, amplitudes of the first AC voltage and the second AC voltage being different from each other. An impedance adjustment device is disposed in midway of the transmission line of the first AC voltage and the second AC voltage output from the AC power supply to the load. The impedance adjustment device adjusts the impedance on the load side when viewed from the AC power supply.

The impedance adjustment device adjusts the impedance on the load side when viewed from the AC power supply by adjusting the reactance of a reactance element disposed in midway of the transmission line. The impedance adjustment device calculates the impedance on the load side based on the information of both the first AC voltage and the second AC voltage.

In the impedance adjustment device, it is considered that the impedance on the load side when viewed from the AC power supply is the calculated impedance on the load side. The impedance adjustment device calculates, for example, the reactance of the reactance element at which the reflection coefficient of the AC voltage when viewed from the AC power supply is zero. The impedance adjustment device determines the target value of the reactance based on the calculated reactance. The impedance adjustment device changes the reactance of the reactance element to the determined target value. Thus, the actual reflection coefficient is maintained at a small value. So-called impedance matching is performed. As a result, electric power can be efficiently supplied to the load side.

SUMMARY

The impedance adjustment device described in Japanese Patent Laid-Open Publication No. 2015-90759 calculates the impedance on the load side based on the information of both the first AC voltage and the second AC voltage. In the impedance adjustment device, it is considered that the actual impedance on the load side is the calculated impedance on the load side. Then, the impedance adjustment device adjusts the reactance of the reactance element. However, the calculated impedance on the load side is not the impedance on the load side when the first AC voltage is output. In addition, the calculated impedance on the load side is not the impedance on the load side when the second AC voltage is output. Therefore, in the power supply system described in Japanese Patent Laid-Open Publication No. 2015-90759, the reflection coefficient does not become zero. In the power supply system, there is always a reflected wave that returns to the AC power supply. Therefore, it is desired to efficiently supply electric power to the load side by reducing the magnitude of reflected waves.

The present disclosure has been made in view of such circumstances, and it is an object of the present disclosure to provide an impedance adjustment device and an impedance adjustment method capable of reducing the magnitude of reflected waves generated in a power supply system in which a first AC voltage and a second AC voltage are alternately output to a load, amplitudes of the first AC voltage and the second AC voltage being different from each other.

An impedance adjustment device according to an aspect of the present disclosure is to be disposed in midway of a transmission line of an AC voltage output from an AC power supply to a load and adjusts an impedance on the load side when viewed from the AC power supply. The AC power supply alternately outputs a first AC voltage and a second AC voltage. Amplitudes of the first AC voltage and the second AC voltage are different from each other. The impedance adjustment device includes: a variable impedance circuit; a first changing unit that changes an impedance of the variable impedance circuit to a first target value when the AC voltage output from the AC power supply is switched to the first AC voltage; and the second changing unit that changes the impedance of the variable impedance circuit to a second target value when the AC voltage output from the AC power supply is switched to the second AC voltage. The second target value is different from the first target value.

An impedance adjustment device according to an aspect of the present disclosure further includes: a first acquiring unit that repeatedly acquires first information regarding the first AC voltage; a first numerical value calculation unit that calculates, based on the first information acquired by the first acquiring unit, a first impedance on the load side when viewed from the AC power supply or a first reflection coefficient of the first AC voltage when viewed from the AC power supply; a first average value calculation unit that calculates an average value of a plurality of first impedances or of a plurality of first reflection coefficients, the plurality of first impedances or the plurality of first coefficients being calculated by the first numerical value calculation unit based on a plurality of pieces of first information acquired by the first acquiring unit within a calculation period including a plurality of first periods, during the first period the first AC voltage being output; and a first determining unit that determines the first target value based on the average value calculated by the first average value calculation unit.

An impedance adjustment device according to an aspect of the present disclosure further includes: a second acquiring unit that repeatedly acquires second information regarding the second AC voltage; a second numerical value calculation unit that calculates, based on the second information acquired by the second acquiring unit, a second impedance on the load side when viewed from the AC power supply or a second reflection coefficient of the second AC voltage when viewed from the AC power supply; a second average value calculation unit that calculates an average value of a plurality of second impedances or of a plurality of second reflection coefficients, the plurality of second impedances or the plurality of second reflection coefficients being calculated by the second numerical value calculation unit based on a plurality of pieces of second information acquired by the second acquiring unit within the calculation period; and a second determining unit that determines the second target value based on the average value calculated by the second average value calculation unit. The calculation period includes the plurality of first periods and a plurality of second periods, during the second period the second AC voltage being output.

In an impedance adjustment device according to an aspect of the present disclosure, the variable impedance circuit includes a plurality of series circuits. In each series circuit, a capacitor and a switch are connected in series. The plurality of series circuits are connected in parallel. The first changing unit and the second changing unit change the impedance of the variable impedance circuit to the first target value and to the second target value respectively by switching one or more switches included in the variable impedance circuit on or off separately.

In an impedance adjustment method according to an aspect of the present disclosure, an impedance on the load side when viewed from an AC power supply is adjusted by changing an impedance of a variable impedance circuit in a power supply system in which the AC power supply alternately outputs a first AC voltage and a second AC voltage, amplitudes of the first AC voltage and the second AC voltage being different from each other. The impedance adjustment method causes a computer to execute processings of changing the impedance of the variable impedance circuit to a first target value when an AC voltage output from the AC power supply is switched to the first AC voltage; and changing the impedance of the variable impedance circuit to a second target value when the AC voltage output from the AC power supply is switched to the second AC voltage, the second target value being different from the first target.

In the impedance adjustment device and the impedance adjustment method according to the aspect described above, the impedance of the variable impedance circuit is the first target value while the first AC voltage is output. The impedance of the variable impedance circuit is the second target value while the second AC voltage is output. The first target value is adjusted to, for example, an impedance at which the reflection coefficient when viewed from the AC power supply becomes a minimum value in a case where the first AC voltage is output. The second target value is adjusted to, for example, an impedance at which the reflection coefficient when viewed from the AC power supply becomes a minimum value in a case where the second AC voltage is output. In this case, since the impedance on the load side is always adjusted to an appropriate impedance, the magnitude of reflected waves can be reduced.

In the impedance adjustment device according to the aspect described above, the average value of the first impedances is calculated when the calculation period including a plurality of first periods passes. It is not necessary to calculate the average value each time the first period passes. Therefore, as a circuit for calculating the average value, an inexpensive circuit having a slow calculation speed can be used. Within the calculation period, a period for repeatedly acquiring the first information is long. Therefore, when the load is, for example, a plasma generator, the first impedance does not change greatly due to minute changes in plasma in the plasma generator.

In the impedance adjustment device according to the aspect described above, the average value of the second impedances is calculated when the calculation period including a plurality of second periods passes. It is not necessary to calculate the average value of the second impedances each time the second period passes. Therefore, as a circuit for calculating the average value, an inexpensive circuit having a slow calculation speed can be used. Within the calculation period, a period for repeatedly acquiring the second information is long. Therefore, when the load is, for example, a plasma generator, the second impedance does not change greatly due to minute changes in plasma in the plasma generator.

In the impedance adjustment device according to the aspect described above, the variable impedance circuit includes a plurality of series circuits. In each series circuit, a capacitor and a switch are connected in series. These series circuits are connected in parallel. The impedance of the variable impedance circuit can be easily changed by switching the plurality of switches on or off separately.

According to the present disclosure, it is possible to reduce the magnitude of reflected waves generated in the power supply system in which the first AC voltage and the second AC voltage are alternately output to the load, amplitudes of the first AC voltage and the second AC voltage being different from each other.

The above and further objects and features will move fully be apparent from the following detailed description with accompanying drawings.

DETAILED DESCRIPTION OF NON-LIMITING EXAMPLE EMBODIMENTS

Hereinafter, the present disclosure will be described in detail with reference to the diagrams showing embodiments thereof.

Embodiment 1

<Configuration of Power Supply System>

Figure 1:
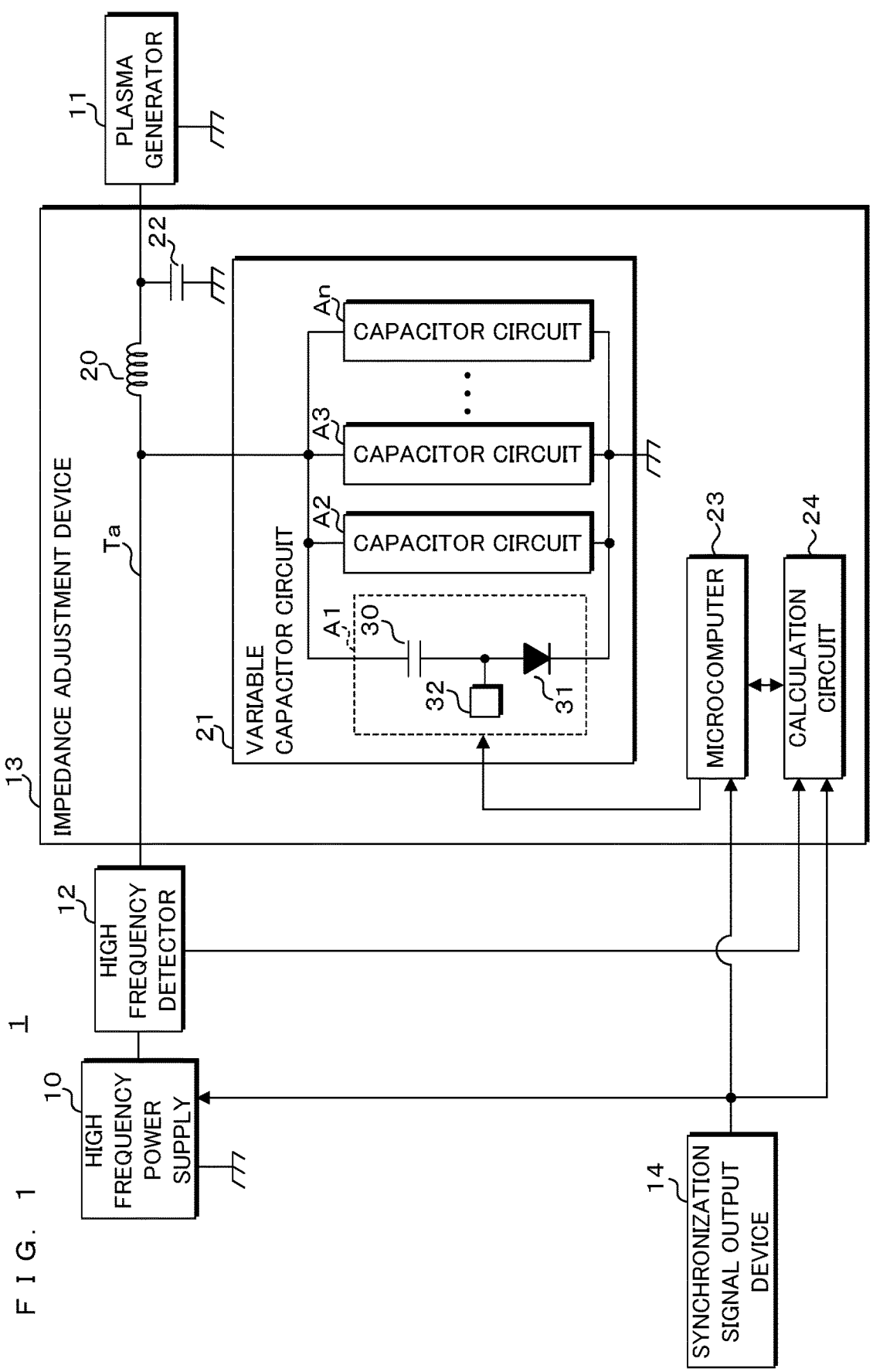
FIG. 1 is a block diagram showing the main configuration of a power supply system according to Embodiment 1.

FIG. 1 is a block diagram showing the main configuration of a power supply system 1 according to Embodiment 1. The power supply system 1 includes a high frequency power supply 10, a plasma generator 11, a high frequency detector 12, an impedance adjustment device 13, and a synchronization signal output device 14. The high frequency power supply 10 is connected to the plasma generator 11 through a transmission line Ta. The high frequency detector 12 and the impedance adjustment device 13 are disposed in midway of the transmission line Ta. The high frequency detector 12 is located between the high frequency power supply 10 and the impedance adjustment device 13. The high frequency power supply 10 and the plasma generator 11 are grounded.

It is noted that the transmission line Ta indicates a transmission line from the high frequency power supply 10 to the plasma generator 11. Therefore, in FIG. 1, the high frequency detector 12 and an inductor 20, which will be described later, are disposed on the transmission line Ta.

The synchronization signal output device 14 outputs a synchronization signal configured by a high level voltage and a low level voltage, to the high frequency power supply 10 and to the impedance adjustment device 13. The high frequency power supply 10 is an AC power supply that outputs an AC voltage having a high frequency based on the synchronization signal input from the synchronization signal output device 14.

Figure 2:
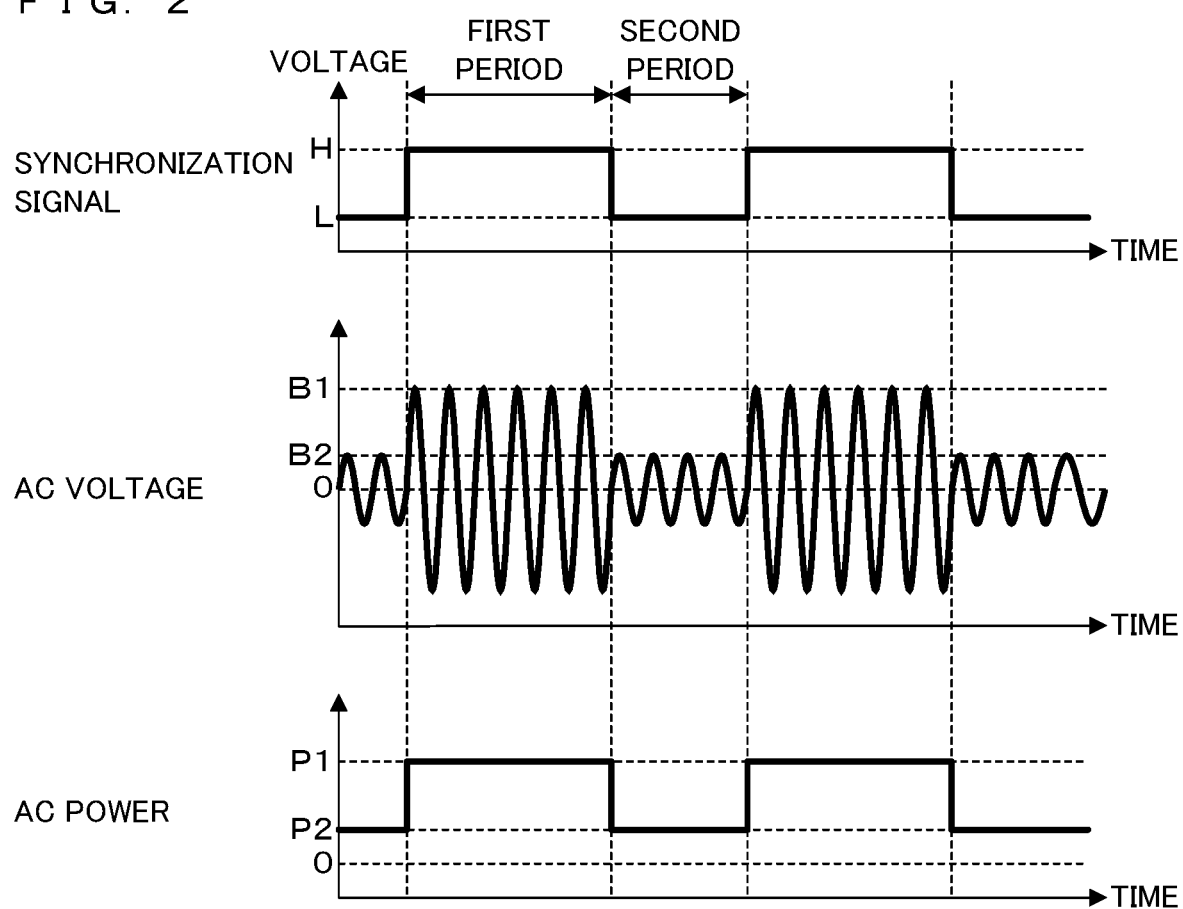
FIG. 2 is a timing chart for describing the operation of a high frequency power supply.

FIG. 2 is a timing chart for describing the operation of the high frequency power supply 10. FIG. 2 shows the transition of the voltage of the synchronization signal, the waveform of the AC voltage output from the high frequency power supply 10, and the transition of the AC power output from the high frequency power supply 10. For these transitions and the waveform, the horizontal axis indicates time. In FIG. 2, the high level voltage and the low level voltage are indicated by "H" and "L", respectively. In diagrams other than FIG. 2, the high level voltage and the low level voltage are indicated by "H" and "L", respectively.

As shown in FIG. 2, the voltage of the synchronization signal is periodically switched to the low level voltage and to the high level voltage. The duty of the synchronization signal is fixed to various values. The duty of the synchronization signal is a ratio occupied by a period, during which the synchronization signal indicates a high level voltage, in one cycle. In the example of FIG. 2, the duty is 60%.

When the synchronization signal indicates a high level voltage, the high frequency power supply 10 outputs a first AC voltage having a first amplitude B1 as its amplitude. When the synchronization signal indicates a low level voltage, the high frequency power supply 10 outputs a second AC voltage having a second amplitude B2 as its amplitude. The high frequency power supply 10 alternately outputs the first AC voltage and the second AC voltage. The first amplitude B1 and the second amplitude B2 are fixed values and are set in advance. The first amplitude B1 is different from the second amplitude B2. In the example of FIG. 2, the first amplitude B1 is larger than the second amplitude B2. The frequencies of the first AC voltage and the second AC voltage are common frequencies. The frequencies of the first AC voltage and the second AC voltage are frequencies belonging to the industrial radio frequency (RF) band. Frequencies belonging to the industrial RF band include 400 kHz, 2 MHz, 13.56 MHz, 27.12 MHz, 40.68 MHz, 60 MHz, and the like.

The high frequency power supply 10 outputs the first AC voltage and the second AC voltage to the plasma generator 11 through the high frequency detector 12 and the impedance adjustment device 13. At this time, the first AC voltage and the second AC voltage output from the high frequency power supply 10 are transmitted through the transmission line Ta. The output impedance of the high frequency power supply 10 is expressed by for example, only the real part. In this case, the output impedance is, for example, 50Ω.

The high frequency power supply 10 outputs first AC power P1 by outputting the first AC voltage. The high frequency power supply 10 outputs second AC power P2 by outputting the second AC voltage. The first AC power P1 and the second AC power P2 are fixed values and exceed 0 W. The first AC power P1 is different from the second AC power P2. In the example of FIG. 2, the first AC power P1 is larger than the second AC power P2.

The plasma generator 11 shown in FIG. 1 generates plasma by using the first AC voltage and the second AC voltage input from the high frequency power supply 10. When the type of the plasma generator 11 is a capacitive coupling type, the plasma generator 11 includes a plate-shaped upper electrode and a plate-shaped lower electrode. The plate surface of the upper electrode faces the plate surface of the lower electrode. The first AC voltage and the second AC voltage output from the high frequency power supply 10 are alternately applied to the upper electrode. The lower electrode is grounded. By applying the first AC voltage and the second AC voltage, plasma is generated between the upper electrode and the lower electrode. The first AC voltage and the second AC voltage may be alternately output to the lower electrode. In this case, the upper electrode is grounded.

When the type of the plasma generator 11 is an inductive coupling type, the plasma generator 11 includes an inductor. One end of the inductor is grounded. The first AC voltage and the second AC voltage output from the high frequency power supply 10 are alternately applied to the other end of the inductor. Thus, plasma is generated in the inductor.

The plasma generated by the plasma generator 11 is used for processing, such as etching or chemical vapor deposition (CVD). In the plasma generator 11, the state of the plasma changes over time while the processing is performed. When the state of plasma changes, the impedance of the plasma generator 11 changes.

In a state in which the high frequency power supply 10 outputs the first AC voltage, the impedance on the plasma generator 11 side when viewed from the high frequency power supply 10 is referred to as a first impedance. In the similar state, the reflection coefficient of the first AC voltage on the plasma generator 11 side when viewed from the high frequency power supply 10 is referred to as a first reflection coefficient. In a state in which the high frequency power supply 10 outputs the second AC voltage, the impedance on the plasma generator 11 side when viewed from the high frequency power supply 10 is referred to as a second impedance. In the similar case, the reflection coefficient of the second AC voltage on the plasma generator 11 side when viewed from the high frequency power supply 10 is referred to as a second reflection coefficient. The reflection coefficient is a complex number. The absolute value of the reflection coefficient is 0 or more and 1 or less.

Each of the first impedance and the second impedance is one of following two impedances. One impedance is an impedance when the plasma generator 11 side is viewed from the output end of the high frequency power supply 10. The other impedance is an impedance when the plasma generator 11 side is viewed from the input end of the first AC voltage and the second AC voltage in the impedance adjustment device 13. The input end of the impedance adjustment device 13 corresponds to the output end of the high frequency power supply 10. Each of the first impedance and the second impedance is a combined impedance of the impedance of the impedance adjustment device 13 and the impedance of the plasma generator 11.

The high frequency detector 12 periodically detects first parameters regarding the first AC voltage during a first period in which the high frequency power supply 10 outputs the first AC voltage. The high frequency detector 12 generates first parameter information indicating the detected first parameters. The impedance adjustment device 13 acquires the first parameter information from the high frequency detector 12. Similarly the high frequency detector 12 periodically detects second parameters regarding the second AC voltage during a second period in which the high frequency power supply 10 outputs the second AC voltage. The high frequency detector 12 generates second parameter information indicating the detected second parameters. The impedance adjustment device 13 acquires the second parameter information from the high frequency detector 12.

The impedance adjustment device 13 calculates the first impedance or the first reflection coefficient based on the first parameter information. The impedance adjustment device 13 calculates the second impedance or the second reflection coefficient based on the second parameter information. The first parameter information and the second parameter information correspond to first information and second information, respectively.

As a first example of the first parameters, a first AC voltage, a first AC current corresponding to the first AC voltage, and a phase difference between the first AC voltage and the first AC current can be mentioned. As a second example of the first parameters, forward wave power (or forward wave voltage) and reflected wave power (or reflected wave voltage) can be mentioned. Here, the forward wave voltage is the first AC voltage transmitting toward the plasma generator 11. The forward wave power is the power of the forward wave voltage. The reflected wave voltage is an AC voltage that is reflected by the plasma generator 11 and that transmits toward the high frequency power supply 10. The reflected wave power is the power of the reflected wave voltage. The second parameters are similar to the first parameters. By replacing the first AC voltage with the second AC voltage in the description of the example of the first parameters, the example of the second parameters can be described.

The impedance adjustment device 13 adjusts the first impedance and the second impedance by changing the impedance of the impedance adjustment device 13. As described above, the impedance adjustment device 13 calculates the first impedance or the first reflection coefficient based on the first parameter information. The impedance adjustment device 13 calculates the second impedance or the second reflection coefficient based on the second parameter information.

Based on the calculation result, the impedance adjustment device 13 changes the impedance of the impedance adjustment device 13 so that the first impedance becomes a complex conjugate of the output impedance of the high frequency power supply 10 during the first period or so that the reflection coefficient becomes a minimum value during the first period. When the first impedance cannot be adjusted to the complex conjugate of the output impedance, the impedance adjustment device 13 adjusts the impedance of the impedance adjustment device 13 so that the first impedance becomes a value closest to the complex conjugate of the output impedance.

Based on the calculation result, the impedance adjustment device 13 performs, during the second period, the similar change as the impedance change performed during the first period. By replacing the first impedance with the second impedance in the description of the impedance change of the impedance adjustment device 13 performed during the first period, the impedance change performed during the second period can be described.

<Configuration of Impedance Adjustment Device 13>

The impedance adjustment device 13 includes the inductor 20, a variable capacitor circuit 21, a capacitor 22, a microcomputer 23, and a calculation circuit 24. The inductor 20 is disposed in midway of the transmission line Ta. One end of the variable capacitor circuit 21 is connected to one end of the inductor 20 on the high frequency detector 12 side. One end of the capacitor 22 is connected to one end of the inductor 20 on the plasma generator 11 side. The other ends of the variable capacitor circuit 21 and the capacitor 22 are grounded.

The circuit including the inductor 20, the variable capacitor circuit 21, and the capacitor 22 is a π-type circuit. The circuit included in the impedance adjustment device 13 is not limited to the π-type circuit. The circuit included in the impedance adjustment device 13 may be an L-type circuit, a T-type circuit, or the like. The following circuit can be mentioned as a first example of the L-type circuit. In this circuit, one end of the variable capacitor circuit 21 is connected to one end or the other end of a series circuit including the inductor 20 and the capacitor 22. The other end of the variable capacitor circuit 21 is grounded. The following circuit can be mentioned as a second example of the L-type circuit. In this circuit, one end of the capacitor 22 is connected to one end or the other end of a series circuit including the inductor 20 and the variable capacitor circuit 21. The other end of the capacitor 22 is grounded.

The following circuit can be mentioned as an example of the T-type circuit. In this circuit, the inductor 20 is connected in series to an inductor (not shown). One end of the variable capacitor circuit 21 is connected to a connection node between the inductor 20 and the inductor. The other end of the variable capacitor circuit 21 is grounded.

Hereinafter, an example in which the impedance adjustment device 13 includes a π-type circuit will be described.

The variable capacitor circuit 21 includes n capacitor circuits A1, A2, ..., An connected in parallel. Here, n is an integer of 2 or more. Each of the capacitor circuits A1, A2, ..., An includes a capacitor 30, a PIN diode 31, and a driving unit 32. In each of the capacitor circuits A1, A2, ..., An, one end of the capacitor 30 is connected to one end of the inductor 20. The other end of the capacitor 30 is connected to the anode of the PIN diode 31. The cathode of the PIN diode 31 is grounded. In this manner, the capacitor 30 is connected in series to the PIN diode 31. The driving unit 32 is connected to a connection node between the capacitor 30 and the PIN diode 31.

The parallelism of the n capacitor circuits A1, A2, ..., An does not mean strict parallelism, but means substantial parallelism. Therefore, for example, a series circuit of the capacitor circuit A2 and a resistor (not shown) may be connected between both ends of the capacitor circuit A1.

The driving unit 32 applies, to the anode of the PIN diode 31, a positive voltage having reference potential corresponding to a ground potential. Thus, a forward voltage is applied to the PIN diode 31. In addition, the driving unit 32 applies, to the anode of the PIN diode 31, a negative voltage having reference potential corresponding to the ground potential. Thus, a reverse voltage is applied to the PIN diode 31.

In the PIN diode 31, P-type, I-type, and N-type semiconductor layers are bonded to each other. The I-type semiconductor is an intrinsic semiconductor. The I-type semiconductor layer is disposed between the P-type semiconductor layer and the N-type semiconductor layer. An anode and a cathode are provided on the P-type semiconductor layer and the N-type semiconductor layer, respectively. The PIN diode 31 functions as a switch.

When the driving unit 32 applies a forward voltage to the PIN diode 31, the resistance value between both ends of the PIN diode 31 drops to a sufficiently small value. As a result, the PIN diode 31 is switched on. When the driving unit 32 applies a reverse voltage to the PIN diode 31, the resistance value between both ends of the PIN diode 31 rises to a sufficiently large value. As a result, the PIN diode 31 is switched off. As described above, the driving unit 32 switches the PIN diode 31 connected the driving unit 32 on or off. When the PIN diode 31 is ON, the AC voltage can pass through the PIN diode 31. When the PIN diode 31 is OFF, the AC voltage cannot pass through the PIN diode 31.

The microcomputer 23 outputs a high level voltage or a low level voltage to the n driving units 32 included in the variable capacitor circuit 21. When the voltage input from the microcomputer 23 is switched from the low level voltage to the high level voltage, each driving unit 32 switches the PIN diode 31 on. When the voltage input from the microcomputer 23 is switched from the high level voltage to the low level voltage, each driving unit 32 switches the PIN diode 31 off.

When the number of PIN diodes 31 in the ON state is 2 or more, the capacitance of the variable capacitor circuit 21 is expressed by the sum of the capacitances of the plurality of capacitors 30 connected to the plurality of PIN diodes 31 in the ON state. When the number of PIN diodes 31 in the ON state is 1, the capacitance of the variable capacitor circuit 21 is expressed by the capacitance of the capacitor 30 connected to the PIN diode 31 in the ON state.

The capacitance of the capacitor 30 included in the capacitor circuit Ai ($i=1, 2, \ldots, n$) is expressed by the product of a positive real value and $(i-1)$-th power of 2. Therefore, the capacitance of the variable capacitor circuit 21 can be adjusted at an interval of the above-described real value. When the real value is 1 pF, the capacitance of the variable capacitor circuit 21 can be adjusted at an interval of 1 pF.

As described above, the variable capacitor circuit 21 is a circuit capable of changing the capacitance, that is, the impedance. The variable capacitor circuit 21 functions as a variable impedance circuit. The capacitance of the variable capacitor circuit 21 corresponds to the impedance of the variable impedance circuit.

The synchronization signal output device 14 outputs the synchronization signal not only to the high frequency power supply 10 but also to the microcomputer 23 and the calculation circuit 24. The calculation circuit 24 acquires the first parameter information and the second parameter information from the high frequency detector 12. The first parameters indicated by the first parameter information acquired by the calculation circuit 24 substantially matches the first parameters at the time of acquisition. Similarly, the second parameters indicated by the second parameter information acquired by the calculation circuit 24 substantially matches the second parameters at the time of acquisition. The microcomputer 23 outputs, to the calculation circuit 24, a start signal, which gives an instruction to start the calculation of the first impedance and the second impedance.

The calculation circuit 24 is formed by, for example, a field-programmable gate array (FPGA). The calculation circuit 24 performs a calculation process for calculating a first average value and a second average value. The first average value is the average value of the first impedances or of the first reflection coefficients. The second average value is the average value of the second impedances or of the second reflection coefficients. In the calculation process, the calculation circuit 24 repeatedly acquires the first parameter information and the second parameter information until the calculation period passes after the start signal is input from the microcomputer 23. The calculation period is k cycles of the synchronization signal. Here, k is an integer of 2 or more.

The calculation period includes a plurality of first periods and a plurality of second periods. The calculation circuit 24 calculates the first impedance or the first reflection coefficient each time the first parameter information is acquired. In addition, the calculation circuit 24 calculates the second impedance or the second reflection coefficient each time the second parameter information is acquired. When the calculation period has passed, the calculation circuit 24 calculates the first average value and the second average value. The calculation circuit 24 outputs average information indicating the calculated first average value and the calculated second average value to the microcomputer 23.

When the average information is input from the calculation circuit 24, the microcomputer 23 determines a first target value and a second target value regarding the capacitance of the variable capacitor circuit 21 based on the first average value and the second average value indicated by the average information input from the calculation circuit 24.

As described above, the microcomputer 23 switches the output voltages, which are output to the n driving units 32 included in the variable capacitor circuit 21, to a high level voltage or to a low level voltage. Thus, the n PIN diodes 31 included in the variable capacitor circuit 21 are switched on or off separately. The microcomputer 23 can easily change the capacitance of the variable capacitor circuit 21 by switching the n PIN diodes 31 on or off separately. When the voltage of the synchronization signal is switched to the high level voltage, the microcomputer 23 changes the capacitance of the variable capacitor circuit 21 to the first target value. When the voltage of the synchronization signal is switched to the high level voltage, the first period starts. When the voltage of the synchronization signal is switched to the low level voltage, the microcomputer 23 changes the capacitance of the variable capacitor circuit 21 to the second target value. When the voltage of the synchronization signal is switched to the low level voltage, the second period starts.

Hereinafter, the operations of the calculation circuit 24 and the microcomputer 23 will be described in detail.

<Calculation Process of Calculation Circuit 24>

Figure 3:
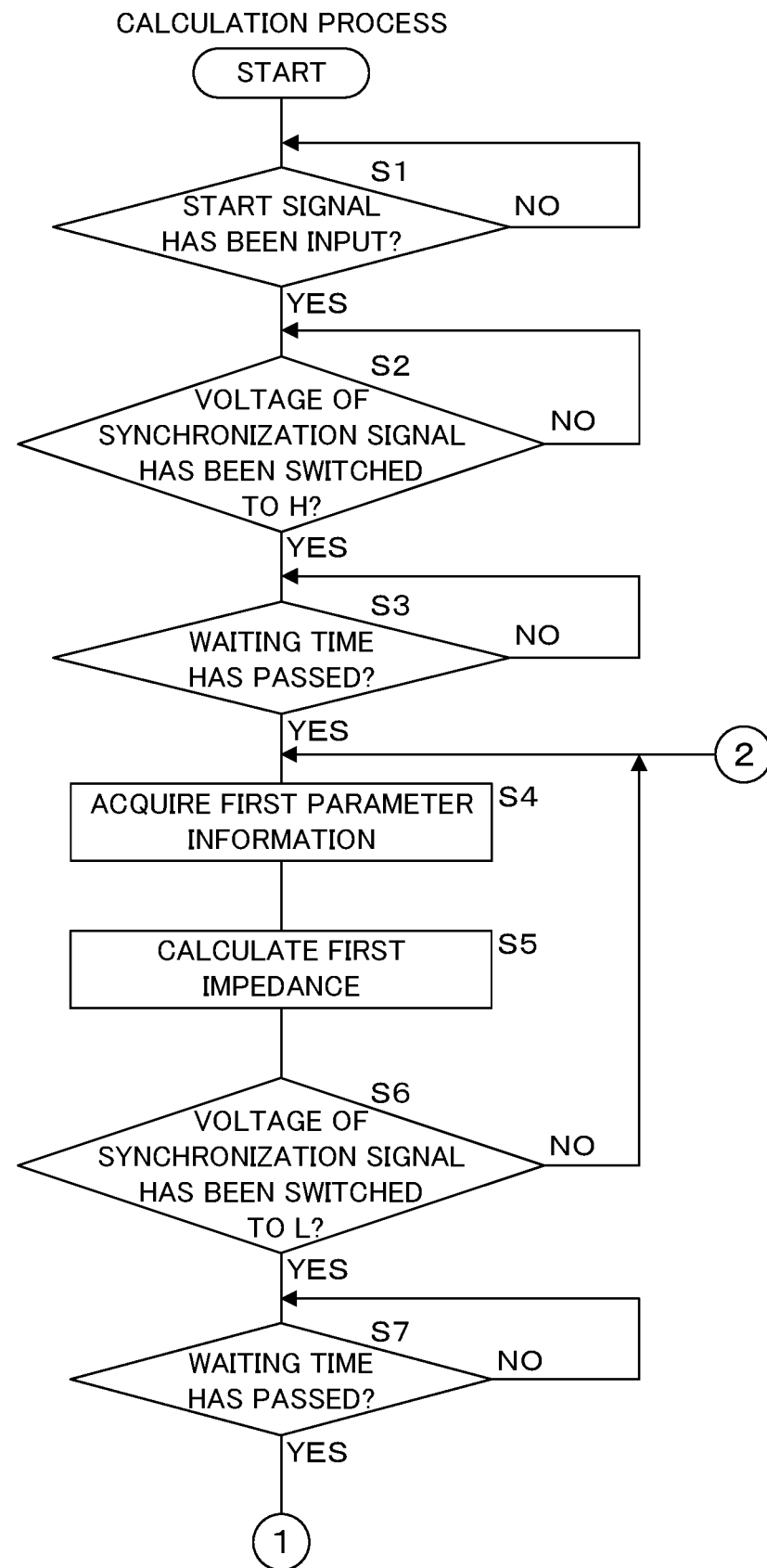
FIG. 3 is a flowchart showing the procedure of a calculation process of a calculation circuit.
Figure 4:
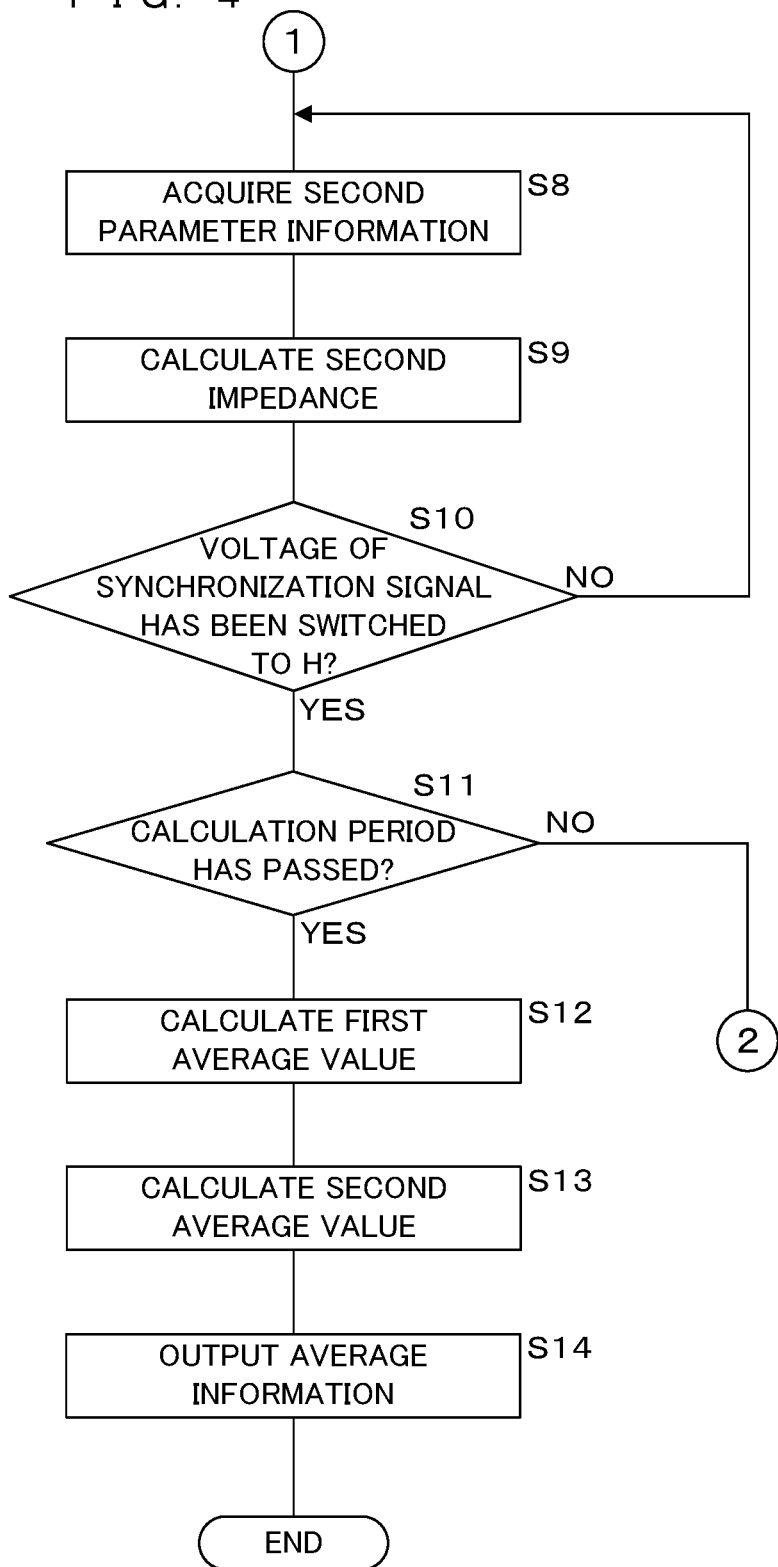
FIG. 4 is a flowchart showing the procedure of the calculation process of the calculation circuit.

FIGS. 3 and 4 are flowcharts showing the procedure of the calculation process of the calculation circuit 24. Here, the calculation process for calculating the first average value of the first impedances and the second average value of the second impedances will be described.

In the calculation process, the calculation circuit 24 determines whether or not a start signal has been input from the microcomputer 23 (step S1). When it is determined that the start signal has not been input (S1: NO), the calculation circuit 24 executes step S1 again and waits until the start signal is input. When it is determined that the start signal has been input (S1: YES), the calculation circuit 24 determines whether or not the voltage of the synchronization signal has been switched from the low level voltage to the high level voltage (step S2).

When it is determined that the voltage of the synchronization signal has not been switched to the high level voltage (S2: NO), the calculation circuit 24 executes step S2 again, and waits until the voltage of the synchronization signal is switched from the low level voltage to the high level voltage. When it is determined that the voltage of the synchronization signal has been switched to the high level voltage (S2: YES), the calculation circuit 24 determines whether or not the waiting time has passed after the voltage of the synchronization signal is switched to the high level voltage (step S3). The waiting time is a fixed value, and is set in advance. The calculation circuit 24 executes step S3 using, for example, a timer (not shown). In this case, the timer measures the time that has passed after the voltage of the synchronization signal is switched to the high level voltage.

When it is determined that the waiting time has not passed (S3: NO), the calculation circuit 24 executes step S3 again and waits until the waiting time passes. As described above, when the voltage of the synchronization signal is switched to the high level voltage, the microcomputer 23 changes the capacitance of the variable capacitor circuit 21 to the first target value. By waiting until the waiting time passes, the calculation circuit 24 waits until the capacitance becomes stable after the capacitance is changed to the first target value. The waiting time is sufficiently shorter than the first and second periods.

When it is determined that the waiting time has passed (S3: YES), the calculation circuit 24 acquires the first parameter information from the high frequency detector 12 (step S4), and calculates the first impedance based on the first parameters indicated by the acquired first parameter information (step S5). Then, the calculation circuit 24 determines whether or not the voltage of the synchronization signal has been switched from the high level voltage to the low level voltage (step S6). When it is determined that the voltage of the synchronization signal has not been switched to the low level voltage (S6: NO), the calculation circuit 24 executes step S4 again. The calculation circuit 24 repeats the acquisition of the first parameter information and the calculation of the first impedance until the voltage of the synchronization signal is switched from the high level voltage to the low level voltage.

When it is determined that the voltage of the synchronization signal has been switched to the low level voltage (S6: YES), the calculation circuit 24 determines whether or not the waiting time has passed (step S7) as in step S3. When a timer is used, the timer measures the time that has passed after the voltage of the synchronization signal is switched to the low level voltage.

When it is determined that the waiting time has not passed (S7: NO), the calculation circuit 24 executes step S7 again and waits until the waiting time passes. As described above, when the voltage of the synchronization signal is switched to the low level voltage, the microcomputer 23 changes the capacitance of the variable capacitor circuit 21 to the second target value. By waiting until the waiting time passes, the calculation circuit 24 waits until the capacitance becomes stable after the capacitance is changed to the second target value.

When it is determined that the waiting time has passed (ST-YES), the calculation circuit 24 acquires the second parameter information from the high frequency detector 12 (step S8). Then, the calculation circuit 24 calculates the second impedance based on the second parameters indicated by the second parameter information acquired in step S8 (step S9). After executing step S9, the calculation circuit 24 determines whether or not the voltage of the synchronization signal has been switched from the low level voltage to the high level voltage (step S10). When it is determined that the voltage of the synchronization signal has not been switched to the high level voltage (S10: NO), the calculation circuit 24 executes step S8 again. The calculation circuit 24 repeats the acquisition of the second parameter information and the calculation of the second impedance until the voltage of the synchronization signal is switched from the low level voltage to the high level voltage.

When it is determined that the voltage of the synchronization signal has been switched to the high level voltage (S10: YES), the calculation circuit 24 determines whether or not the calculation period has passed after the calculation circuit 24 determines in step S2 that the voltage of the synchronization signal has been switched to the high level voltage (step S11). As described above, the calculation period is k cycles. Therefore, the calculation period passes at the timing when the voltage of the synchronization signal is switched to the high level voltage. The calculation circuit 24 executes step S11 using, for example, a timer. In this case, the timer measures the time that has passed after the voltage of the synchronization signal is switched to the high level voltage in step S2.

When it is determined that the calculation period has not passed (S11: NO), the calculation circuit 24 executes step S4 again to calculate the first impedance and the second impedance. When it is determined that the calculation period has passed (S11: YES), the calculation circuit 24 calculates the first average value of the plurality of first impedances calculated during the calculation period (step S12). After executing step S12, the calculation circuit 24 calculates the second average value of the plurality of second impedances calculated during the calculation period (step S13). Then, the calculation circuit 24 outputs, to the microcomputer 23, average information indicating the first average value and the second average value calculated in steps S12 and S13 (step S14).

After executing step S14, the calculation circuit 24 ends the calculation process. After the end of the calculation process, the calculation circuit 24 restarts the calculation process and waits until the start signal is input from the microcomputer 23.

As described above, the calculation circuit 24 repeatedly acquires the first parameter information and the second parameter information during the calculation period. The calculation circuit 24 calculates the first impedance based on the acquired first parameter information. The calculation circuit 24 calculates the second impedance based on the acquired second parameter information. The calculation circuit 24 calculates the average value of the plurality of first impedances calculated based on the plurality of pieces of first parameter information acquired within the calculation period. The calculation circuit 24 calculates the average value of the plurality of second impedances calculated based on the plurality of pieces of second parameter information acquired within the calculation period. The calculation circuit 24 functions as a first acquiring unit, a first numerical value calculation unit, a first average value calculation unit, a second acquiring unit, a second numerical value calculation unit, and a second average value calculation unit.

A calculation process for calculating the first average value of the first reflection coefficients and the second average value of the second reflection coefficients is similar to the calculation process for calculating the first average value of the first impedances and the second average value of the second impedances. In the description of the calculation process for calculating the first impedance and the second impedance, the first impedance and the second impedance are replaced with the first reflection coefficient and the second reflection coefficient, respectively. Therefore, the calculation process for calculating the first reflection coefficient and the second reflection coefficient can be described.

The calculation circuit 24 may be configured to include a processor that executes processing. The processor is, for example, a central processing unit (CPU). In this case, in the calculation circuit 24, a computer program is stored in a storage unit (not shown), and the processor executes the calculation process by executing the computer program.

The computer program may be stored in a storage medium so as to be readable by the processor of the calculation circuit 24. In this case, the computer program read from the storage medium by a reader (not shown) is written in the storage unit of the calculation circuit 24. The storage medium is an optical disk, a flexible disk, a magnetic disk, a magneto-optical disk, a semiconductor memory, or the like. The optical disk is a compact disc (CD)-read only memory (ROM), a digital versatile disc (DVD)-ROM, a Blu-ray (registered trademark) disc (BD), or the like. The magnetic disk is, for example, a hard disk. In addition, a computer program may be downloaded from an external device (not shown) connected to a communication network (not shown), and the downloaded computer program may be written in a storage unit.

<Configuration of Microcomputer 23>

Figure 5:
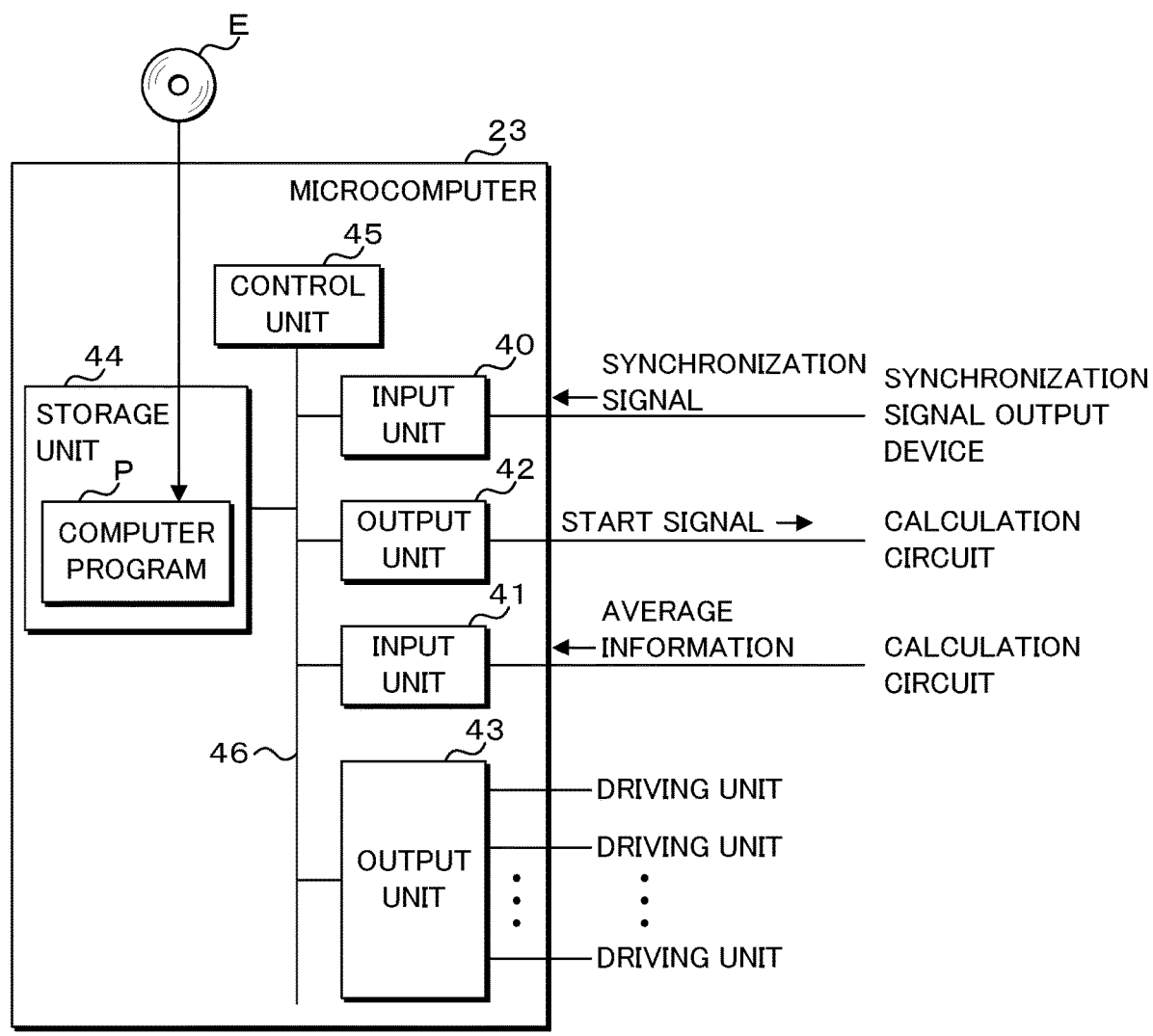
FIG. 5 is a block diagram showing the main configuration of a microcomputer.

FIG. 5 is a block diagram showing the main configuration of the microcomputer 23. The microcomputer 23 includes input units 40 and 41, output units 42 and 43, a storage unit 44, and a control unit 45. These are connected to an internal bus 46. The input unit 40 is also connected to the synchronization signal output device 14. Each of the input unit 41 and the output unit 42 is also connected to the calculation circuit 24. The output unit 43 is also connected to the n driving units 32 of the n capacitor circuits A1, A2, . . . , An separately.

The synchronization signal output device 14 outputs a synchronization signal to the input unit 40. The output unit 42 outputs a start signal to the calculation circuit 24 according to an instruction from the control unit 45. The calculation circuit 24 outputs the average information to the input unit 41. The output unit 43 outputs a high level voltage or a low level voltage to the n driving units 32. The output unit 43 separately switches the voltages output to the n driving units 32 to a high level voltage or a low level voltage according to an instruction from the control unit 45.

First target value information indicating the first target value and second target value information indicating the second target value are stored in the storage unit 44. The first target value and the second target value indicated by the first target value information and the second target value information are updated by the control unit 45. A computer program P is stored in the storage unit 44. The control unit 45 includes a processor that executes processing. The processor is, for example, a CPU. The processor of the control unit 45 performs a capacitance change process and a target value determination process in parallel by executing the computer program P. In the capacitance change process, the capacitance of the variable capacitor circuit 21 is changed. In the target value determination process, the first target value and the second target value are determined.

The computer program P may be stored in a storage medium E so as to be readable by the processor of the control unit 45. In this case, the computer program P read from the storage medium E by a reader (not shown) is written in the storage unit 44 of the microcomputer 23. The storage medium E is an optical disk, a flexible disk, a magnetic disk, a magneto-optical disk, a semiconductor memory, or the like. In addition, the computer program P may be downloaded from an external device (not shown) connected to a communication network (not shown). In this case, the downloaded computer program P is written in the storage unit 44.

The number of processors included in the control unit 45 may be 2 or more. In this case, a plurality of processors may cooperatively perform the capacitance change process and the target value determination process.

<Capacitance Change Process>

Figure 6:
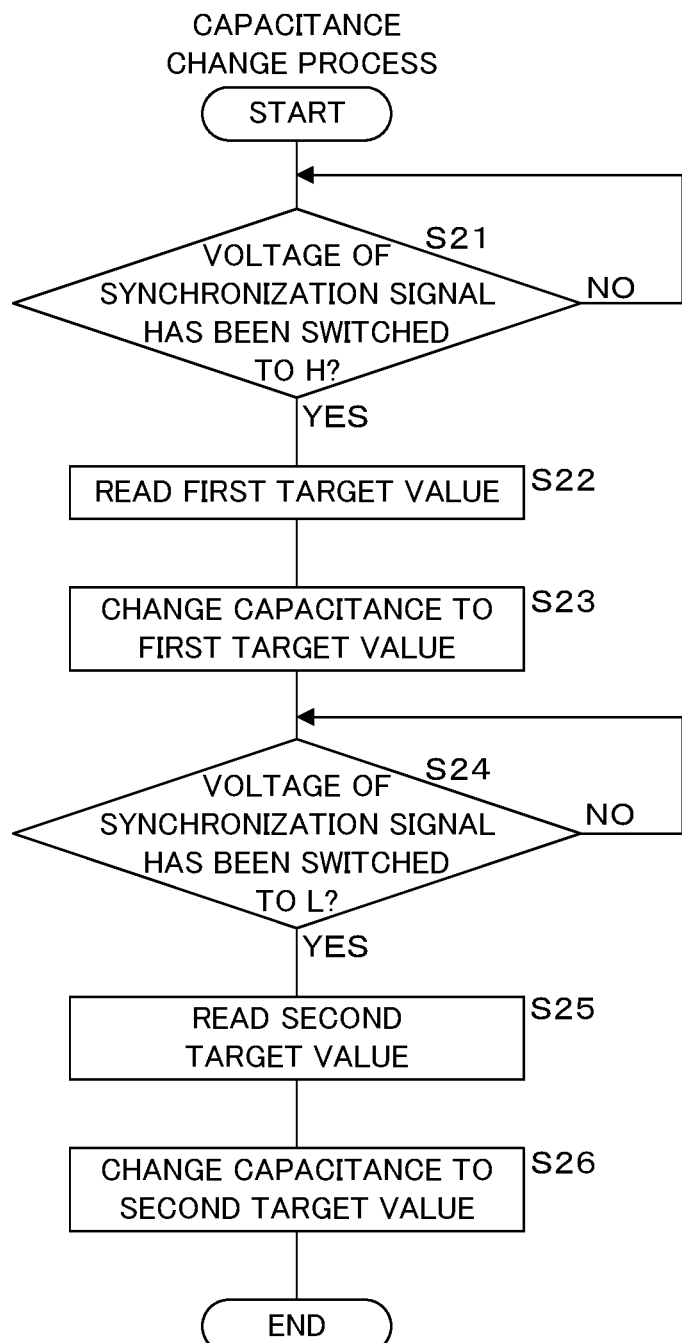
FIG. 6 is a flowchart showing the procedure of a capacitance change process.

FIG. 6 is a flowchart showing the procedure of the capacitance change process. In the capacitance change process, the control unit 45 determines whether or not the voltage of the synchronization signal output from the synchronization signal output device 14 to the input unit 40 has been switched from the low level voltage to the high level voltage (step S2*l*). When it is determined that the voltage of the synchronization signal has not been switched to the high level voltage (S21: NO), the control unit 45 executes step S21 again, and waits until the voltage of the synchronization signal is switched from the low level voltage to the high level voltage.

When it is determined that the voltage of the synchronization signal has been switched to the high level voltage (S21: YES), the control unit 45 reads the first target value indicated by the first target value information (step S22). Then, the control unit 45 changes the capacitance of the variable capacitor circuit 21 to the first target value read in step S22 by switching one or more PIN diodes 31 on or off separately (step S23). Here, the one or more PIN diodes 31 are all the PIN diodes 31 that need to be switched in order to change the capacitance of the variable capacitor circuit 21 to the first target value. The control unit 45 instructs the output unit 43 to separately switch the output voltages, which are to be output to one or more driving units 32 corresponding to the one or more PIN diodes 31, to high level voltages or to low level voltages. Thus, the control unit 45 realizes the switching of one or more PIN diodes 31 to ON or OFF. When step S23 is executed, the first impedance is changed.

After executing step S23, the control unit 45 determines whether or not the voltage of the synchronization signal output from the synchronization signal output device 14 to the input unit 40 has been switched from the high level voltage to the low level voltage (step S24). When it is determined that the voltage of the synchronization signal has not been switched to the low level voltage (S24: NO), the control unit 45 executes step S24 again, and waits until the voltage of the synchronization signal is switched to the low level voltage.

When it is determined that the voltage of the synchronization signal has been switched to the low level voltage (S24: YES), the control unit 45 reads the second target value indicated by the second target value information (step S25). Then, in the similar manner as in step S23, the control unit 45 changes the capacitance of the variable capacitor circuit 21 to the second target value read in step S25 by switching one or more PIN diodes 31 on or off (step S26). Here, the one or more PIN diodes 31 are all the PIN diodes 31 that need to be switched in order to change the capacitance of the variable capacitor circuit 21 to the second target value. When step S25 is executed, the second impedance is changed.

After executing step S26, the control unit 45 ends the capacitance change process. After the end of the capacitance change process, the control unit 45 performs the capacitance change process again and waits until the voltage of the synchronization signal is switched from the low level voltage to the high level voltage.

As described above, in the capacitance change process, the control unit 45 changes the capacitance of the variable capacitor circuit 21 to the first target value when the voltage of the synchronization signal is switched to the high level voltage. When the voltage of the synchronization signal is switched to the high level voltage, the AC voltage output from the high frequency power supply 10 is switched to the first AC voltage. When the voltage of the synchronization signal is switched to the low level voltage, the control unit 45 changes the capacitance of the variable capacitor circuit 21 to the second target value. When the voltage of the synchronization signal is switched to the low level voltage, the AC voltage output from the high frequency power supply 10 is switched to the second AC voltage. The control unit 45 functions as a first change unit and a second change unit.

<Target Value Determination Process>

Figure 7:
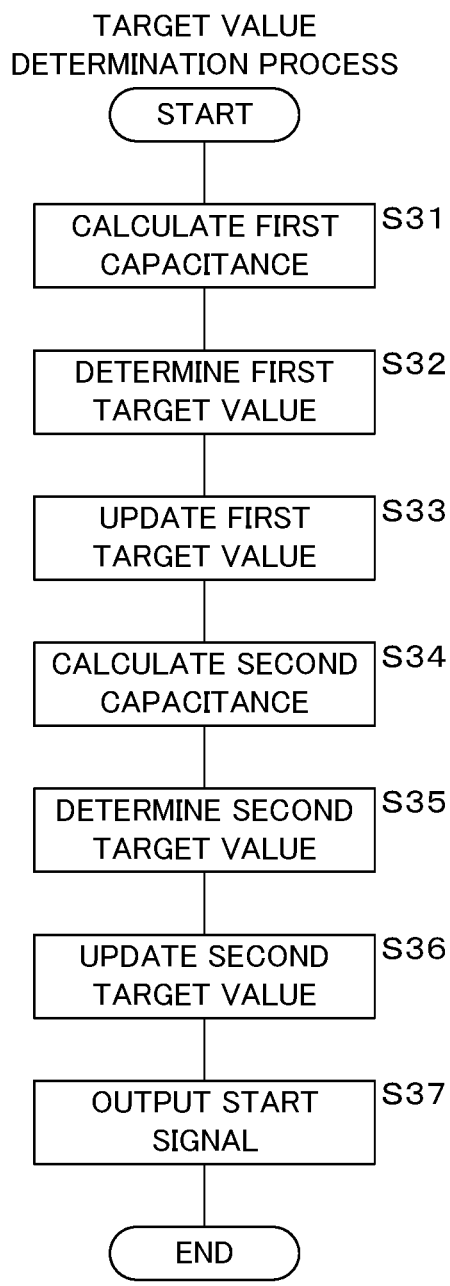
FIG. 7 is a flowchart showing the procedure of a target value determination process.

FIG. 7 is a flowchart showing the procedure of the target value determination process. The control unit 45 performs the target value determination process when the average information is input from the calculation circuit 24 to the input unit 41. Here, the target value determination process performed when the average information indicating the first average value of the first impedances and the second average value of the second impedances is input will be described.

In the target value determination process, the control unit 45 calculates a first capacitance, at which the first impedance becomes a complex conjugate of the output impedance of the high frequency power supply 10, based on the first average value of the first impedances indicated by the average information input to the input unit 41 (step S3*l*). Then, the control unit 45 determines a first target value based on the first capacitance calculated in step S31 (step S32). Here, the first target value is a capacitance that can be realized in the variable capacitor circuit 21. The first target value is a capacitance that matches the calculated first capacitance or is closest to the calculated first capacitance. The control unit 45 also functions as a first determining unit.

Then, the control unit 45 updates the first target value indicated by the first target value information to the first target value determined in step S32 (step S33). After executing step S33, when the first period starts, the capacitance of the variable capacitor circuit 21 is changed to the first target value determined in step S32.

Then, the control unit 45 calculates a second capacitance, at which the second impedance becomes a complex conjugate of the output impedance of the high frequency power supply 10, based on the second average value of the second impedances indicated by the average information input to the input unit 41 (step S34). Then, the control unit 45 determines a second target value based on the second capacitance calculated in step S34 (step S35). Here, the second target value is a capacitance that can be realized in the variable capacitor circuit 21. The second target value is a capacitance that matches the calculated second capacitance or is closest to the calculated second capacitance. The control unit 45 also functions as a second determining unit.

Then, the control unit 45 updates the second target value indicated by the second target value information to the second target value determined in step S35 (step S36). After executing step S36, when the second period starts, the capacitance of the variable capacitor circuit 21 is changed to the second target value determined in step S35.

After executing step S36, the control unit 45 instructs the output unit 42 to output a start signal to the calculation circuit 24 (step S37). Thus, the calculation circuit 24 repeatedly calculates the first impedance and the second impedance in the calculation process. The calculation circuit 24 calculates a first average value of the plurality of calculated first impedances and a second average value of the plurality of calculated second impedances.

After executing step S37, the control unit 45 ends the target value determination process.

The target value determination process performed when the average information indicating the first average value of the first reflection coefficients and the second average value of the second reflection coefficients is input is similar to the target value determination process performed when the average information indicating the first average value of the first impedances and the second average value of the second impedances is input. In step S31 of the target value determination process of the first reflection coefficient and the second reflection coefficient, the first capacitance at which the first reflection coefficient becomes zero is calculated. In step S35 of the target value determination process of the first reflection coefficient and the second reflection coefficient, the second capacitance at which the second reflection coefficient becomes zero is calculated. When the output unit 42 outputs a start signal to the calculation circuit 24, the calculation circuit 24 repeatedly calculates the first reflection coefficient and the second reflection coefficient. The calculation circuit 24 calculates a first average value of the plurality of calculated first reflection coefficients and a second average value of the plurality of calculated second reflection coefficients.

<Operation of Impedance Adjustment Device 13>

Figure 8:
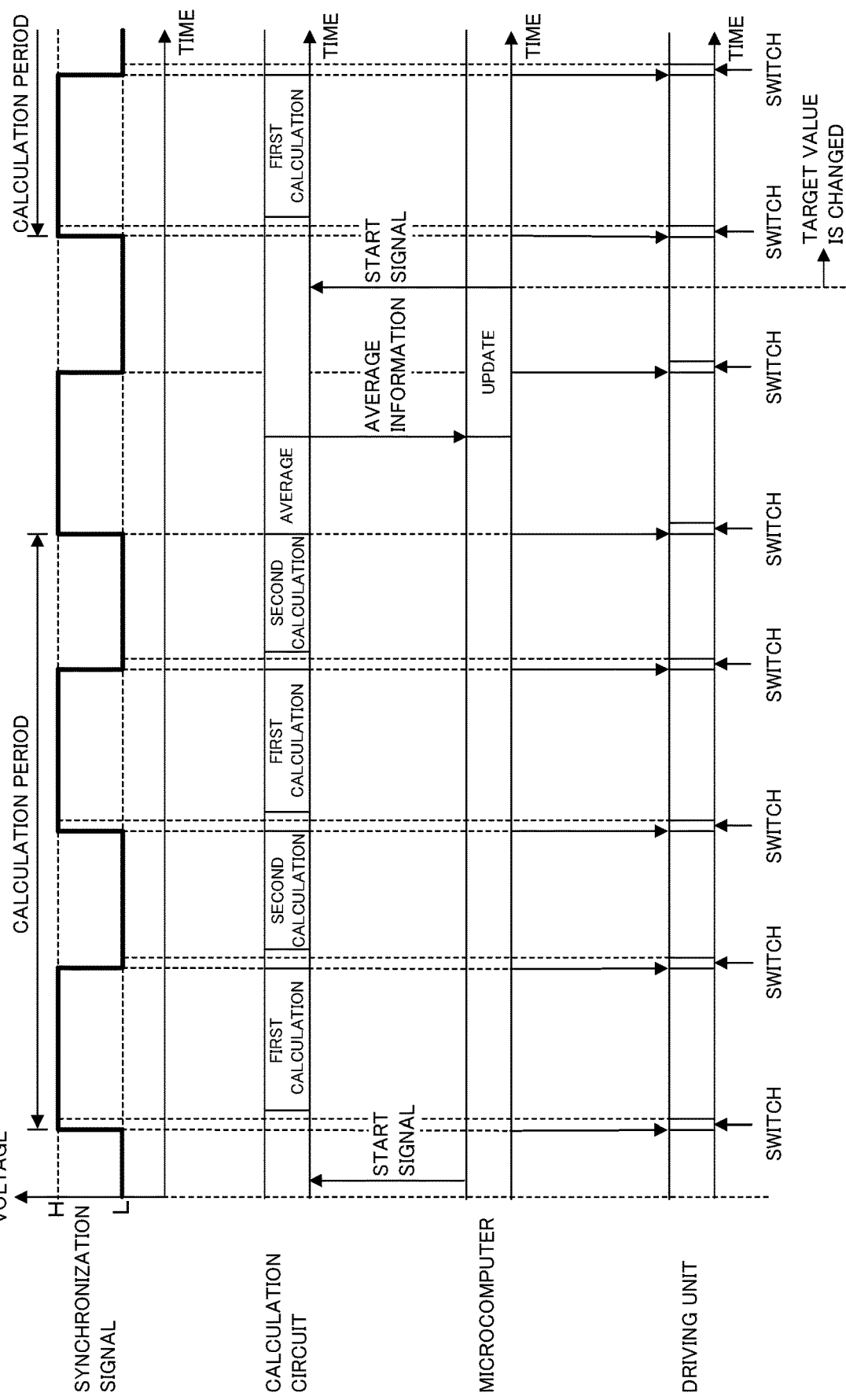
FIG. 8 is a timing chart for describing the operation of an impedance adjustment device.

FIG. 8 is a timing chart for describing the operation of the impedance adjustment device 13. FIG. 8 shows the transition of the voltage of the synchronization signal. FIG. 8 further shows the processes performed by the calculation circuit 24, the microcomputer 23, and the driving unit 32 in chronological order. Time is shown on the horizontal axes. In FIG. 8, the calculation of the first impedance or the first reflection coefficient is referred to as a first calculation. The calculation of the second impedance or the second reflection coefficient is referred to as a second calculation. FIG. 8 shows an example in which k is 2, that is, an example in which the calculation period is two cycles of the synchronization signal.

As shown in FIG. 8, when the voltage of the synchronization signal is switched from the low level voltage to the high level voltage, the microcomputer 23 instructs one or more driving units 32 to switch one or more PIN diodes 31 on or off. Thus, the capacitance of the variable capacitor circuit 21 is changed to the first target value indicated by the first target value information. When the voltage of the synchronization signal is switched from the high level voltage to the low level voltage, the microcomputer 23 instructs one or more driving units 32 to switch one or more PIN diodes 31 on or off. Thus, the capacitance of the variable capacitor circuit 21 is changed to the second target value indicated by the second target value information.

Therefore, during the first period in which the high frequency power supply 10 outputs the first AC voltage, the capacitance of the variable capacitor circuit 21 is the first target value indicated by the first target value information. During the second period in which the high frequency power supply 10 outputs the second AC voltage, the capacitance of the variable capacitor circuit 21 is the second target value indicated by the second target value information.

As shown in FIG. 8, when the voltage of the synchronization signal is switched from the low level voltage to the high level voltage after the output unit 42 of the microcomputer 23 outputs a start signal to the calculation circuit 24, the calculation period starts. The calculation circuit 24 repeatedly calculates the first impedance or the first reflection coefficient during the calculation period. In addition, the calculation circuit 24 repeatedly calculates the second impedance or the second reflection coefficient during the calculation period. The microcomputer 23 repeatedly calculates the first impedance or the first reflection coefficient after the waiting time passes from the switching of the voltage of the synchronization signal to the high level voltage in each of the k first periods. The microcomputer 23 repeatedly calculates the second impedance or the second reflection coefficient after the waiting time passes from the switching of the voltage of the synchronization signal to the low level voltage in each of the k second periods.

The time for switching one or more PIN diodes 31 on or off is referred to as a switching time. The time required for the capacitance of the variable capacitor circuit 21 to stabilize after switching one or more PIN diodes 31 on or off is referred to as a stabilization time. The waiting time is longer than the total time of the switching time and the stabilization time. Therefore, the first parameters indicated by the first parameter information acquired by the calculation circuit 24 are first parameters detected by the high frequency detector 12 in a state in which the capacitance of the variable capacitor circuit 21 is stable. Similarly the second parameters indicated by the second parameter information acquired by the calculation circuit 24 are second parameters detected by the high frequency detector 12 in a state in which the capacitance of the variable capacitor circuit 21 is stable.

When the calculation period passes, the calculation circuit 24 calculates a first average value based on the plurality of first impedances or the plurality of first reflection coefficients calculated during the calculation period. In addition, the calculation circuit 24 calculates a second average value based on the plurality of second impedances or the plurality of second reflection coefficients calculated during the calculation period. The calculation circuit 24 outputs, to the input unit 41 of the microcomputer 23, average information indicating the calculated first average value and the calculated second average value. The calculation circuit 24 stops the calculation after outputting the average information. The calculation circuit 24 restarts the calculation when the voltage of the synchronization signal is switched from the low level voltage to the high level voltage after the start signal is input again.

When the average information is input to the input unit 41, the control unit 45 of the microcomputer 23 determines a first target value and a second target value based on the first average value and the second average value indicated by the input average information. The control unit 45 updates the first target value and the second target value indicated by the first target value information and the second target value information to the determined first target value and the determined second target value. After the update is performed, the first target value or the second target value is changed.

<Effect of Impedance Adjustment Device 13>

As described above, the capacitance of the variable capacitor circuit 21 is adjusted to the first target value during the first period in which the high frequency power supply 10 outputs the first AC voltage. During the second period in which the high frequency power supply 10 outputs the second AC voltage, the capacitance of the variable capacitor circuit 21 is adjusted to the second target value. In this case, the impedance on the plasma generator 11 side when viewed from the high frequency power supply 10 is always adjusted to an appropriate impedance. Therefore, since the magnitude of reflected waves is reduced, electric power can be efficiently supplied to the plasma generator 11.

In addition, the calculation circuit 24 calculates an average value of the first impedances and an average value of the second impedances when the calculation period including the plurality of first periods and the plurality of second periods passes. It is not necessary to calculate the average value of the first impedances each time the first period passes. It is not necessary to calculate the average value of the second impedances each time the second period passes. Therefore, as the calculation circuit 24, an inexpensive circuit having a slow calculation speed can be used.

In addition, within the calculation period, a period during which the calculation circuit 24 repeatedly acquires the first parameter information is long. Therefore, the first impedance does not change greatly due to minute changes in the state of plasma in the plasma generator 11. Similarly, within the calculation period, a period during which the calculation circuit 24 repeatedly acquires the second parameter information is long. Therefore, the second impedance does not change greatly due to minute changes in the state of plasma in the plasma generator 11.

<Notes>

There is no problem as long as the variable capacitor circuit 21 functions as a circuit that can change its own impedance. Therefore, one of following two circuits may be used instead of the variable capacitor circuit 21. One circuit is a circuit that can change its own resistance value and reactance. The other circuit is a circuit that can change its own reactance. The number of first impedances calculated by the calculation circuit 24 during the first period may be one. The number of second impedances calculated by the calculation circuit 24 during the second period may also be one.

The number of cycles of the synchronization signal included in the calculation period may be one. The number of cycles of the synchronization signal included in the calculation period is the value of k. When the number of cycles of the synchronization signal is 1, the number of first impedances calculated by the calculation circuit 24 during the first period is 2 or more. In addition, the number of second impedances calculated by the calculation circuit 24 during the second period is also 2 or more. In the impedance adjustment device 13, the process performed by the calculation circuit 24 may be performed by the control unit 45 of the microcomputer 23. In this case, parameter information is output from the high frequency detector 12 to the microcomputer 23 of the impedance adjustment device 13.

Also in a period other than the calculation period, the calculation circuit 24 may repeat the calculation of the first impedance and the second impedance or the calculation of the first reflection coefficient and the second reflection coefficient. In the configuration in which the calculation of the first impedance and the second impedance is repeated, the first impedance and the second impedance calculated in the period other than the calculation period are not used. In the configuration in which the calculation of the first reflection coefficient and the second reflection coefficient is repeated, the first reflection coefficient and the second reflection coefficient calculated in the period other than the calculation period are not used. There is no problem as long as the PIN diode 31 functions as a switch. Therefore, a field effect transistor (FET), a bipolar transistor, a relay contact, and the like may be used instead of the PIN diode 31. The load to which the high frequency power supply 10 outputs an AC voltage is not limited to the plasma generator 11, and may be, for example, a non-contact power transmission device.

Embodiment 2

In Embodiment 1, when the type of the plasma generator 11 is a capacitive coupling type, the first AC voltage and the second AC voltage are alternately applied to one of the upper electrode and the lower electrode in a state in which the other of the upper electrode and the lower electrode is grounded. However, an AC voltage may be applied to both the upper electrode and the lower electrode.

Hereinafter, the differences between Embodiments 1 and 2 will be described. Other configurations excluding the configuration described below are common to those in Embodiment 1. Therefore, the components common to those in Embodiment 1 are denoted by the same reference numerals. The description of the common components will be omitted.

<Configuration of Power Supply System 1>

Figure 9:
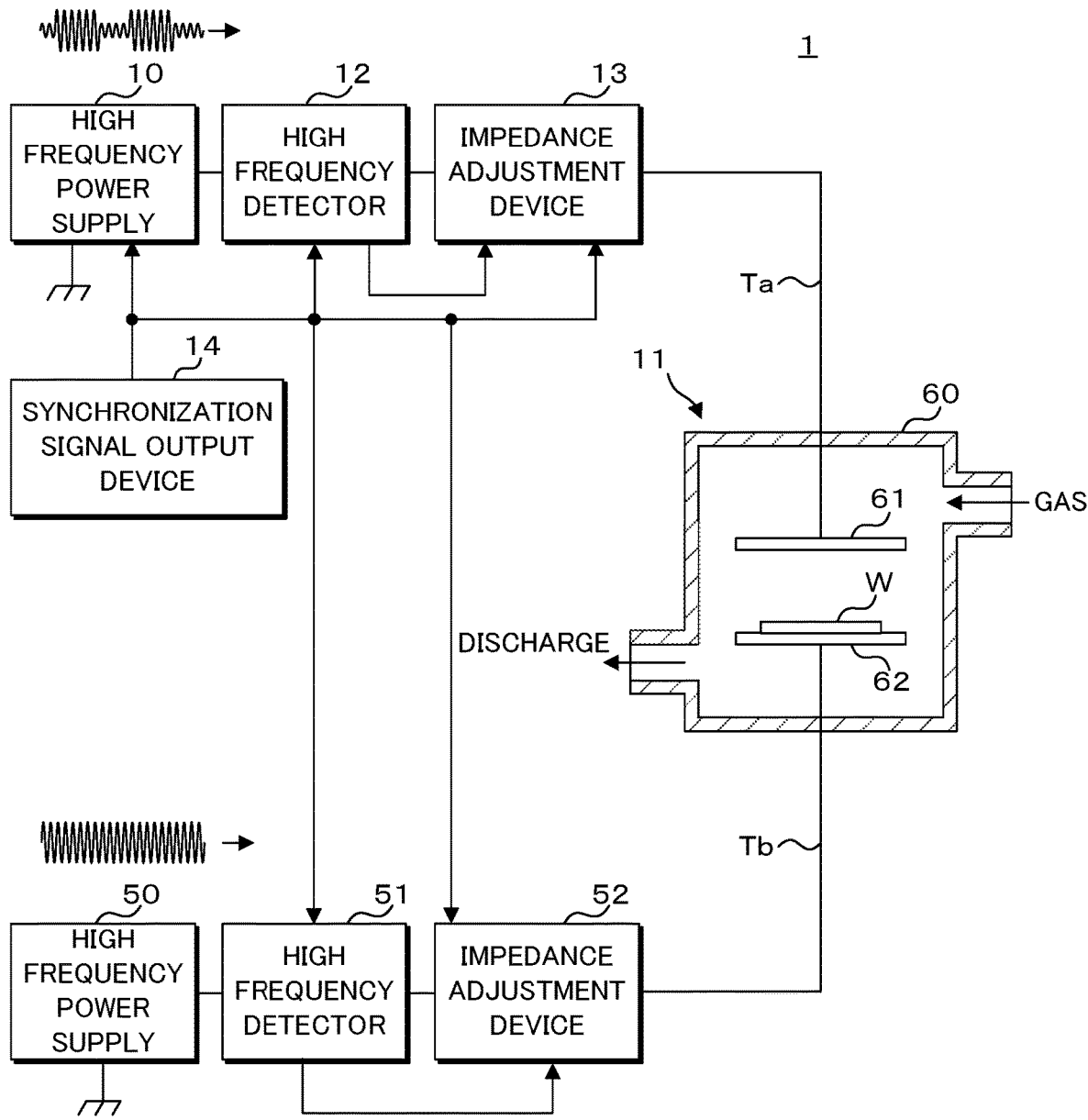
FIG. 9 is a block diagram showing the main configuration of a power supply system according to Embodiment 2.

FIG. 9 is a block diagram showing the main configuration of a power supply system 1 according to Embodiment 2. The power supply system 1 according to Embodiment 2 includes a high frequency power supply 10, a plasma generator 11, a high frequency detector 12, an impedance adjustment device 13, and a synchronization signal output device 14, as in Embodiment 1. Their connections are similar to those in Embodiment 1.

The power supply system 1 according to Embodiment 2 further includes a high frequency power supply 50, a high frequency detector 51, and an impedance adjustment device 52. The plasma generator 11 according to Embodiment 2 includes an injection container 60, an upper electrode 61, and a lower electrode 62. FIG. 9 shows a cross section of the injection container 60. The injection container 60 is formed in a box shape and has two through holes. Gas is injected into the injection container 60 through one of the through holes. Substance is discharged from the other through hole. Each of the upper electrode 61 and the lower electrode 62 is formed in a plate shape. The upper electrode 61 and the lower electrode 62 are housed in the injection container 60. The plate surface of the upper electrode 61 faces the plate surface of the lower electrode 62.

The upper electrode 61 is connected to the impedance adjustment device 13. In the impedance adjustment device 13, as shown in FIG. 1, when a π-type circuit is formed by the inductor 20, the variable capacitor circuit 21, and the capacitor 22, one end of the inductor 20 on the capacitor 22 side is connected to the upper electrode 61. The high frequency power supply 10, the plasma generator 11, the high frequency detector 12, the impedance adjustment device 13, and the synchronization signal output device 14 operate in the similar manner as in Embodiment 1. Therefore, the first AC voltage and the second AC voltage are alternately applied to the upper electrode 61.

The high frequency power supply 50 is connected to the lower electrode 62 of the plasma generator 11 through a transmission line Tb. The high frequency detector 51 and the impedance adjustment device 52 are disposed in midway of the transmission line Tb. The high frequency detector 51 is located between the high frequency power supply 50 and the impedance adjustment device 52. The high frequency power supply 50 is grounded.

The high frequency power supply 50 is an AC power supply that outputs an AC voltage having a high frequency. The frequency of the AC voltage output from the high frequency power supply 50 is a frequency belonging to the industrial RF band. Frequencies belonging to the industrial RF band are 400 kHz, 2 MHz, 13.56 MHz, 27.12 MHz, 40.68 MHz, 60 MHz, and the like. The high frequency power supply 50 outputs the AC voltage to the lower electrode 62 of the plasma generator 11 through the high frequency detector 51 and the impedance adjustment device 52. At this time, the AC voltage output from the high frequency power supply 50 is transmitted through the transmission line Tb. The output impedance of the high frequency power supply 50 is expressed by, for example, only the real part. In this case, the output impedance is, for example, 50Ω.

The amplitude of the AC voltage output from the high frequency power supply 50 is fixed. The frequency of the AC voltage may match the frequencies of the first AC voltage and the second AC voltage. The frequency of the AC voltage output from the high frequency power supply 50 may be different from the frequencies of the first AC voltage and the second AC voltage. Regarding the plasma generator 11, it is assumed that the first AC voltage and the second AC voltage are alternately applied to the upper electrode 61 and the AC voltage is applied to the lower electrode 62 while the gas is injected into the injection container 60. In this case, plasma is generated between the upper electrode 61 and the lower electrode 62. An object W to be processed is disposed on the plate surface of the lower electrode 62 on the upper electrode 61 side. In the plasma generator 11, processing such as etching or CVD is performed on the object W using plasma.

In Embodiment 2, the synchronization signal output device 14 outputs a synchronization signal not only to the high frequency power supply 10, the high frequency detector 12, and the impedance adjustment device 13 but also to the high frequency detector 51 and the impedance adjustment device 52. When the AC voltage output from the high frequency power supply 10 shown on the upper side of FIG. 9 is changed, the impedance on the plasma generator 11 side when viewed from the high frequency power supply 50 changes in the similar manner as the impedance on the plasma generator 11 side when viewed from the high frequency power supply 10.

The impedance on the plasma generator 11 side when viewed from the high frequency power supply 50 is one of following two impedances. One impedance is an impedance when the plasma generator 11 side is viewed from the output end of the high frequency power supply 50. The other impedance is an impedance when the plasma generator 11 side is viewed from the input end of the AC voltage in the impedance adjustment device 52. The input end of the impedance adjustment device 52 corresponds to the output end of the high frequency power supply 50. The impedance on the plasma generator 11 side when viewed from the high frequency power supply 50 is a combined impedance of the impedance of the impedance adjustment device 52 and the impedance of the plasma generator 11.

The high frequency detector 51 and the impedance adjustment device 52 operate in the similar manner as the high frequency detector 12 and the impedance adjustment device 13, respectively. Regarding the high frequency detector 51 and the impedance adjustment device 52, the first parameters are parameters regarding the AC voltage output from the high frequency power supply 50 during the first period in which the high frequency power supply 10 outputs the first AC voltage. The second parameters are parameters regarding the AC voltage output from the high frequency power supply 50 during the second period in which the high frequency power supply 10 outputs the second AC voltage.

Here, as a first examples of the parameters, an AC voltage and an AC current transmitted through the high frequency detector 51 and a phase difference between the AC voltage and the AC current can be mentioned. As a second example of the parameters, forward wave power (or forward wave voltage) and a reflected wave power (or reflected wave voltage) can be mentioned. Here, the forward wave voltage is an AC voltage transmitting from the high frequency power supply 50 to the plasma generator 11. The forward wave power is the power of the forward wave voltage. The reflected wave voltage is an AC voltage that is reflected by the plasma generator 11 and that transmits toward the high frequency power supply 50. The reflected wave power is the power of the reflected wave voltage.

<Effect of Impedance Adjustment Device 13>

Also in Embodiment 2, the impedance adjustment device 13 achieves the similar effects as in Embodiment 1.

<Notes>

In Embodiment 2, two electrodes to which the high frequency power supplies 10 and 50 apply AC voltages may be the lower electrode 62 and the upper electrode 61, respectively. In addition, the power supply system 1 according to Embodiment 2 may include the high frequency power supply 10, the high frequency detector 12, the impedance adjustment device 13, and the synchronization signal output device 14 instead of the high frequency power supply 50, the high frequency detector 51, and the impedance adjustment device 52. In this case, one high frequency power supply 10 alternately applies the first AC voltage and the second AC voltage to the upper electrode 61. The other high frequency power supply 10 alternately applies the first AC voltage and the second AC voltage to the lower electrode 62.

In this case, the rising points or the falling points of two synchronization signals output from the two synchronization signal output devices 14 match each other. The rising point is a point in time at which the voltage indicated by the synchronization signal is switched from the low level voltage to the high level voltage. The falling point is a point in time at which the voltage indicated by the synchronization signal is switched from the high level voltage to the low level voltage. In addition, for the two synchronization signals, one period is m times the other period. Here, m is a natural number. Even in the power supply system 1 configured as described above, the impedance adjustment device 13 achieves the similar effects as in Embodiment 1.

It is noted that, as used herein and in the appended claims, the singular forms "a", "an", and "the" include plural referents unless the context clearly dictates otherwise.

The technical features (configuration requirements) described in Embodiments 1 and 2 can be combined with each other. By combining the technical features (configuration requirements) described in Embodiments 1 and 2 with each other, new technical features can be formed.

It should be considered that Embodiments 1 and 2 disclosed are examples in all points and not restrictive. The scope of the invention is defined by the claims rather than the meanings set forth above, and is intended to include all modifications within the scope and meaning equivalent to the claims.

What is claimed is:

1. An impedance adjustment device that is to be disposed in midway of a transmission line of an AC voltage output from an AC power supply to a load and that adjusts an impedance when viewed from the AC power supply, comprising:
   a variable impedance circuit comprising one or more diodes each connecting a capacitor to the variable impedance circuit; and
   a processor; and
   a calculation circuit,
   wherein the AC power supply alternately outputs a first AC voltage and a second AC voltage,
   wherein a first period and a second period are alternately repeated, during the first period the first AC voltage being output, during the second period the second AC voltage being output,
   amplitudes of the first AC voltage and the second AC voltage are different from each other,
   the processor changes an impedance of the variable impedance circuit to a first target value when the AC voltage output from the AC power supply is switched to the first AC voltage,
   the processor changes the impedance of the variable impedance circuit to a second target value when the AC voltage output from the AC power supply is switched to the second AC voltage,
   the second target value is different from the first target value,
   a calculation period for calculating an impedance or a reflection coefficient and a target value determination period for determining a target value of the impedance of the variable impedance circuit, are alternately repeated,
   the calculation period includes a plurality of the first periods and a plurality of the second periods,
   the calculation circuit repeatedly acquires first information regarding the first AC voltage within each first period included in the calculation period after a waiting time which is set in advance has passed after each first period starts,
   the waiting time is longer than the total time of a switching time of the one or more diodes of the variable impedance circuit on or off and a stabilization time wherein the capacitance of the variable impedance circuit stabilizes after the one or more diodes have been switched on or off,
   the calculation circuit calculates, based on the acquired first information, a first impedance when viewed from the AC power supply or a first reflection coefficient of the first AC voltage when viewed from the AC power supply,
   within the target value determination period, the calculation circuit calculates an average value of a plurality of first impedances or of a plurality of first reflection coefficients which are calculated within the calculation period, and
   the processor determines the first target value based on the average value calculated by the calculation circuit.

2. The impedance adjustment device according to claim 1, wherein the calculation circuit repeatedly acquires second information regarding the second AC voltage within each second period included in the calculation period,
   the calculation circuit calculates, based on the acquired second information, a second impedance when viewed from the AC power supply or a second reflection coefficient of the second AC voltage when viewed from the AC power supply,
   within the target value determination period, the calculation circuit calculates an average value of a plurality of second impedances or of a plurality of second reflection coefficients which are calculated within the calculation period, and
   the processor determines the second target value based on the average value calculated by the calculation circuit.

3. The impedance adjustment device according to claim 2, wherein the calculation circuit repeatedly acquires the second information regarding the second AC voltage within each second period included in the calculation period, after a waiting time which is set in advance has passed after the second period starts.

4. The impedance adjustment device according to claim 1, wherein the variable impedance circuit includes a plurality of series circuits, in each series circuit, a capacitor and a switch are connected in series, the plurality of series circuits are connected in parallel, and the processor changes the impedance of the variable impedance circuit to the first target value and to the second target value by switching one or more switches included in the variable impedance circuit on or off separately.

* * * * *